United States Patent Office 3,794,510

Patented Feb. 26, 1974

3,794,510
ELECTRON BEAM MASKING METHOD

Luciano C. Scala, Murrysville, and David F. Ciliberti, Pittsburgh, Pa., assignors to Westinghouse Electric Corporation, Pittsburgh, Pa.

No Drawing. Filed Jan. 21, 1972, Ser. No. 219,881
Int. Cl. B44d *1/50;* C08f *3/16*
U.S. Cl. 117—8 19 Claims

ABSTRACT OF THE DISCLOSURE

A method of masking a substrate by coating the substrate with a diene-derived linear polymer having at least one active hydrogen for every ten repeating units, insolubilizing the polymer by exposing it to an electron beam, and removing the unexposed portions of the polymer coating. Specifically, a substrate of $SiO_2$ on a silicon chip may be masked from an HF etchant by applying a benzene solution of 1,2-syndiotactic polybutadiene or a random copolymer of styrene and butadiene to the substrate. The solution is spun to dryness and the resulting polymeric layer is exposed to an electron beam which traces desired patterns on the polymeric layer. The chip is then washed in benzene and etched in HF.

BACKGROUND OF THE INVENTION

Printed circuits may be made on chips of silicon metal by oxidizing the surface to form an insulating substrate of silicon dioxide, protecting the substrate with a negative resist, and cross-linking portions of the negative resist with radiation to form an insoluble pattern. The resist is developed and unprotected portions of the silicon dioxide substrate are etched away.

Although ultraviolet light is a commonly used type of insolubilizing radiation as many resists are sensitive to it, much greater resolution can be obtained with an electron beam because the wavelength of an electron in the beam is much shorter than that of ultraviolet light and because a metal mask is not required. However, few resists are both electron beam sensitive and, at the same time, resistant to etchants such as hydrofluoric acid. Polystyrene and cis-polyisoprene have been used as electron beam sensitive resists, but polystyrene is not very sensitive and cis-polyisoprene is sensitive to UV light as well, which limits its usefulness and its selectivity, since some UV is generated in the electron gun. In addition, sensitivity to ambient UV light severely limits the handle-ability of the material in the laboratory or factory.

SUMMARY OF THE INVENTION

We have found that a pattern on a substrate can be made by coating it with a negative resist consisting of a linear polymer at least 10% diene-derived and having at least one active hydrogen for every ten repeating units, exposing portions of the coating to an electron beam, and removing the unexposed portions. This leaves a pattern on the chip, which, after etching, leads to a desired circuit configuration. The negative resists of this invention are inexpensive and highly resistant to hydrofluoric acid. They wet and adhere to silicon dioxide well, which results in reduced undercutting by the etchant. They are much more sensitive than prior art resists such as polystyrene and give reproducible, high-resolution patterns. Unlike many prior art resists, the preferred negative resists of this invention are insensitive to ultraviolet light and have a shelf life of at least a year.

DESCRIPTION OF THE INVENTION

This substrate is generally a layer of silicon oxides (usually $SiO_2$) about 1000 to about 5000 A. thick on a disk of silicon, although the substrate could also consist of other dielectrics used in printed circuitry. The substrate is generally coated with the polymer of this invention by applying a solution of the polymer to the substrate and permitting the solvent to evaporate. The concentration of the polymer in the solvent must be high enough, within the coating parameters involved, to form a coating relatively free of pin holes; but, if the solids concentration is too high, the solution will be viscous and difficult to spread; about a 10% solution has been found to be a good compromise. The kinematic viscosity of the solution should be less than about five stokes, and preferably less than about 0.1 stoke for a good uniform coating. Suitable solvents include benzene, acetone, methyl ethyl ketone, toluene, cyclohexane, etc. or mixtures thereof; benzene is preferred, as the polymers are readily soluble in it to form solutions of the proper viscosity, and because it evaporates slowly enough to give the solution time to spread uniformly over the substrate.

The solution is applied to the substrate by a process which results in a uniform coating. Although this may be done by spraying, brushing, or dipping, in the preferred process, which more consistently produces uniform coatings, a disk with a substrate layer on top is held by vacuum on a spinner. A drop or two of the solution is placed at the center of the substrate and the disk is spun at about 5000 to 10,000 r.p.m. until the solvent evaporates, which usually takes less than a minute. The coating may be applied in more than one layer, but a single layer is preferred to avoid phase differences between layers.

The coating should be thick enough to prevent pin holes from forming but not so thick that the electron beam exposure time must be unreasonably long or that back-scattering significantly reduces resolution; about 3000 to about 8000 A. is preferred.

The coated substrate is exposed to an electron beam. Generally an energy of about 25K electron volts is used to cause insolubilization. Although microscopic circuit patterns have been produced with the preferred resists of $10^{-8}$ coulombs/cm.$^2$, equipment limitations prevented the determination of maximum resist sensitivities.

After exposure, the coated substrate is developed in a solvent for the polymer which removes the unexposed polymer. The substrate is then etched with a suitable etchant, usually hydrofluoric acid although nitric acid and other etchants may also be used. The etchant etches only through the $SiO_2$ areas left exposed by the development step. The remaining resist is then removed, for example, by degradation with heat followed by washing in a strong solvent.

THE POLYMERS

The polymers of this invention are linear (i.e. uncrosslinked and thermoplastic, which includes branched polymers), at least 10% diene-derived (i.e. at least 10% of the monomers are di- or poly-unsaturated), and preferably have a carbon-chain backbone. They contain as many active (easily abstractable) hydrogens as possible, at least one per every ten repeating units on the average, and preferably at least about one per every two units on the average, where an "active" hydrogen means a hydrogen on a carbon in the backbone of the polymer which also has an electron-withdrawing group on it. For example, the hydrogens in the following groups are active hydrocarbons since the vinylic and phenyl groups are electron-withdrawing:

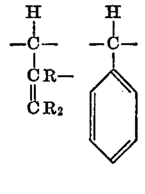

While we do not wish to be bound by theories, we believe that the polymers are rendered insoluble when electrons from the beam remove hydrogen nuclei (protons) from the chain, leaving behind free radicals which initiate crosslinking with other polymer chains. For this reason additional active hydrogens on branch chains are also thought to be desirable.

The polymers generally have a molecular weight (herein number average) of from about 500 to about 100,000. However, since the lower molecular weight polymers are less sensitive and the higher molecular weight polymers are difficult to dissolve, a molecular weight of about 1000 to about 5000 is preferred. The molecular weight distribution should be as narrow as possible in order to achieve the highest possible resolution.

Examples of polymers within the scope of this invention include hydroxy terminated 1,2-polybutadiene

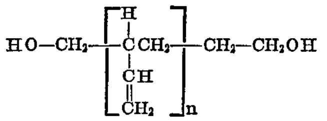

and polyvinyl linolenate:

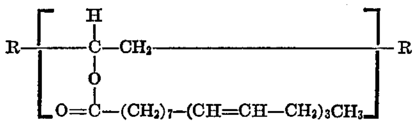

Other examples are isocyanate-modified 1,2-polybutadiene:

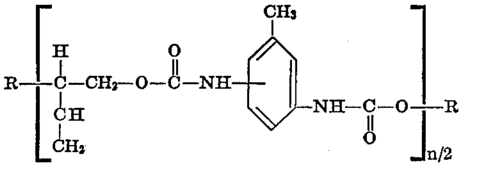

polyesters of hydroxyl terminated 1,2-syndiotactic polybutadiene and acrylic acid, and polyesters of polyhydroxy compounds, such as trimethylolethane or glycerol, with dibasic acids such as terephthalic acid or maleic acid, where the excess hydroxyl groups are reacted with unsaturated acids such as linolenic acid or eleostearic acid.

The preferred polymers, which are the most sensitive, are polybutadienes, specifically 1,2-syndiotactic polybutadiene:

(A)

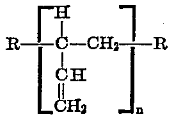

and a styrene-butadiene random copolymer having a ratio of styrene to butadiene of about 9 to 1 to about 1 to 9, the preferred ratio being about 1 to 4:

(B)

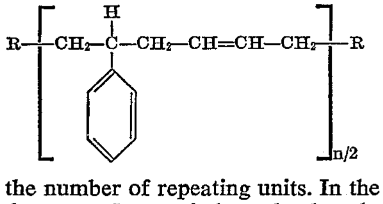

where *n* is the number of repeating units. In the formulae the terminal groups, R, are independently selected from methyl, hydroxyl, carboxyl, isocyanate, esters, or other suitable groups as known in the art to increase solubility or molecular weight; methyl in (A) is preferred because the material with these end groups are the highest sensitivity. In the case of (B) the effect of the end groups is small, unless they are very reactive.

If a polymer is used which has residual vinyl unsaturation, such as 1,2-syndiotactic polybutadiene, about 0.1 to about 2% (by solids), and preferably about 1%, of a vinyl polymerization catalyst may be included in the resist solution. After the unexposed polymer has been developed, but before etching, the catalyst is activated to further cross-link and insolubilize the exposed polymer. This step increases the etch resistance of the resist, improves the final resolution, and reduces undercutting. Examples of such catalysts include cumyl peroxide, tertiary butyl peroxide, and azo-bis isobutyronitrile, but benzoyl peroxide is preferred as it is easy to use, inert at low temperatures, and non-explosive.

The following examples further illustrate this invention.

EXAMPLE 1

The substrates were 1 inch diameter silicon chips covered with a 3,000 to 5,000 A. thick layer of silicon dioxide. Various test resist solutions were made using 5% solutions in benzene of poly-1,4-butadiene, polystyrene, methyl-terminated poly-1,2-butadiene, and methyl-terminated poly-1,2-butadiene including 1% benzoyl peroxide.

A drop or two of each test solution was placed on the center of each chip and they were spun at speeds of 5,000 to 10,000 r.p.m. for 1 minute which evaporated the solvents.

The chips were then exposed to the action of an electron beam which was applied in a computer-controlled scanning electron microscope. This gave a set of exposed lines, each with a different value of exposure obtained by varying the scanning speed, thus varying the effective charge density. The beam accelerating potential was 30 kv. at $1\times10^{-8}$ amps. Lines were obtained with charge densities varying from $2.5\times10^{-3}$ to $9.8\times10^{-6}$ coul./cm.$_2$ for a 16 line raster. In order to further harden the resist, the dips were postbaked for 1 hour at 95° C. in a vacuum oven. The resist was then developed by dipping in benzene for 1–3 minutes in order to dissolve away the portion of the resist not insolubilized by the electron beam. The chips were then immersed for 5 minutes in a 10% solution of hydrofluoric acid.

Results (1) Poly-1,4-butadiene. Only 4 to 8 lines of the 16 line raster appeared. Their width was about 40 microns. After 5 minutes of etching they started to lift from the substrate indicating poor adhesion. The outlines of the exposed section were irregular.

(2) Polystyrene. The number of lines appearing varied from 8 to 11. Their widths varied from above 40 microns to 25–30 microns. Irregular outlines and deterioration of line edges were the effect of HF acid etch.

(3) Modified poly-1,2-butadiene. Sixteen lines were obtained, with widths varying from 20 to about 10 microns. The outlines were fairly sharp, except for the 16th line. The hydrofluoric acid etch lifted the last 3 or 4 lines.

(4) Modified poly-1,2-butadiene including 1% benzoyl peroxide. Sixteen sharp lines were obtained with the last line possessing an irregular structure, but the next to the last line was still regular and sharp. The top width was 20 microns; the width of the next to last line was 12 microns. The hydrofluoric acid etch did not affect the adhesion nor the sharpness of the lines, and the lines were very sharp and well defined.

These results indicated that a minium line width of about 1 micron is possible with the preferred resists of this invention.

EXAMPLE 2

The resist used was a mixture of (a) 50% of a rubbery copolymer of 23% styrene and 77% butadiene having a molecular weight of about 230,000 to 350,000 and has about 75,000 to 100,000 monomeric units and (b) 50% of a resinous copolymer of 85% styrene and 15% butadiene having an unknown but extremely high molecular weight. The resist is sold by Goodyear Rubber Co. under the trademark "Plyoflex 1900" for use as binder in tires.

A benzene solution containing 1.25% of the resist and 1% (based on copolymer weight) benzoyl peroxide was prepared. Three or four drops of the resist solution was placed on a ¾" diameter silicon wafer and spun at 7500 r.p.m. until the benzene evaporated leaving a film about 5000 A. thick. The wafer was exposed to the electron beam pattern described in Example 1 except that the charge densities varied from $2.5\times10^{-5}$ to $9.8\times10^{-8}$ coul./in.$^2$ and $1\times10^{-10}$ amps was used. The wafer was developed by immersion in benzene and gentle stirring for 1 minute. All unexposed portions of the resist developed sharply. The wafer was baked at 100° C. in vacuo for 1 hour. It was then etched for 3 minutes in a 10% solution of H.F. All 16 lines of the raster were sharp.

We claim:

1. A method of masking a substrate comprising:

(1) coating said substrate with a substantially light insensitive linear polymer at least 10% diene-derived having at least one hydrogen for every ten repeating units, said hydrogen being on a carbon atom in the backbone of the polymer, which carbon atom also has on it an electron-withdrawing group;

(2) exposing portions of said polymer coating to an electron beam; and (3) developing the unexposed portions of said polymer coating.

2. A method according to claim 1 wherein said exposed portions are removed by dissolution in a solvent.

3. A method according to claim 1 wherein said polymer is a random copolymer of styrene and butadiene in ratios ranging from about 9 to 1 to about 1 to 9.

4. A method according to claim 1 wherein said coating is about 3000 to about 8000 A. thick.

5. A method according to claim 1 wherein said polymer has a molecular weight of about 1000 to about 5000.

6. A method according to claim 1 wherein said polymer has at least about one of said hydrogens for every two repeating units.

7. A method according to claim 1 including the additional last step of etching said substrate.

8. A method according to claim 7 including the additional last step of removing the exposed polymer by heat degradation.

9. A method according to claim 1 wherein said substrate is an oxide of silicon.

10. A method according to claim 9 wherein said substrate is a layer on a disk of silicon.

11. A method according to claim 9 wherein said substrate is etched with hydrofluoric acid.

12. A method according to claim 1 wherein said polymer has residual vinyl unsaturation, said coating includes a vinyl polymerization catalyst, and said method includes the additional last step of cross-linking said vinyl groups.

13. A method according to claim 12 wherein said catalyst is benzoyl peroxide.

14. A method according to claim 1 wherein said substrate is coated with said polymer by applying a solution of said polymer in a solvent to said substrate.

15. A method according to claim 14 wherein said substrate is spun until said solvent evaporates.

16. A method according to claim 14 wherein said solvent is benzene.

17. A method according to claim 14 wherein the concentration of the polymer in said solution is about 0.1 to about 2% by weight.

18. A method according to claim 14 wherein said solution has a kinematic viscosity of less than about 0.1 stoke.

19. A method of masking a substrate comprising (1) coating said substrate with 1,2-syndiotactic polybutadiene;

(2) exposing portions of said 1,2-syndiotactic polybutadiene to an electron beam; and (3) developing the unexposed portions of said 1,2-syndiotactic polybutadiene.

References Cited

UNITED STATES PATENTS

| | | | |
|---|---|---|---|
| 3,594,170 | 7/1971 | Broyde | 96—36.2 |
| 3,674,486 | 7/1972 | Milgrom | 96—35.1 |
| 3,681,103 | 8/1972 | Brown | 117—8.5 |
| 3,679,497 | 7/1972 | Handy et al. | 117—93.31 |
| 3,703,402 | 11/1972 | Cole | 117—93.31 |

WILLIAM D. MARTIN, Primary Examiner

J. H. NEWSOME, Assistant Examiner

U.S. Cl. X.R.

96—1 E, 35.1, 36.2; 117—5.5, 93.31, 116 UC, UD, UF; 156—8, 17; 250—49.5 TE, 65 R